United States Patent
Kuo et al.

(10) Patent No.: US 11,183,424 B2
(45) Date of Patent: Nov. 23, 2021

(54) BARRIER LAYER FORMATION FOR CONDUCTIVE FEATURE

(71) Applicant: Taiwan Semiconductor Manufacturing Company, Ltd., Hsinchu (TW)

(72) Inventors: Chia-Pang Kuo, Taoyuan (TW); Ya-Lien Lee, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/680,858

(22) Filed: Nov. 12, 2019

(65) Prior Publication Data

US 2020/0083095 A1   Mar. 12, 2020

Related U.S. Application Data

(63) Continuation of application No. 15/993,751, filed on May 31, 2018, now Pat. No. 10,741,442.

(51) Int. Cl.
*H01L 21/768* (2006.01)
*H01L 21/02* (2006.01)
(Continued)

(52) U.S. Cl.
CPC .. *H01L 21/76843* (2013.01); *H01L 21/02068* (2013.01); *H01L 21/02271* (2013.01);
(Continued)

(58) Field of Classification Search
CPC ......... H01L 21/76841; H01L 21/76831; H01L 21/76865; H01L 21/76877;
(Continued)

(56) References Cited

U.S. PATENT DOCUMENTS

| 3,807,008 A | * | 4/1974 | Reedy, Jr. ............... C23C 26/00 428/627 |
| 5,384,485 A | | 1/1995 | Nishida et al. |

(Continued)

FOREIGN PATENT DOCUMENTS

| CN | 105765696 A | 7/2016 |
| CN | 107706189 A | 2/2018 |

(Continued)

*Primary Examiner* — Mohsen Ahmadi
(74) *Attorney, Agent, or Firm* — Slater Matsil, LLP

(57) ABSTRACT

Embodiments described herein relate generally to one or more methods for forming a barrier layer for a conductive feature in semiconductor processing. In some embodiments, an opening is formed through a dielectric layer to a conductive feature. A barrier layer is formed in the opening along a sidewall of the dielectric layer and on a surface of the conductive feature. Forming the barrier layer includes depositing a layer including using a precursor gas. The precursor gas has a first incubation time for deposition on the surface of the conductive feature and has a second incubation time for deposition on the sidewall of the dielectric layer. The first incubation time is greater than the second incubation time. A conductive fill material is formed in the opening and on the barrier layer.

19 Claims, 9 Drawing Sheets

(51) Int. Cl.
- *H01L 21/283* (2006.01)
- *H01L 21/285* (2006.01)
- *H01L 29/45* (2006.01)
- *H01L 23/532* (2006.01)
- *H01L 23/528* (2006.01)
- *H01L 21/3205* (2006.01)
- *H01L 23/522* (2006.01)

(52) U.S. Cl.
CPC .. *H01L 21/28556* (2013.01); *H01L 21/76831* (2013.01); *H01L 21/76856* (2013.01); *H01L 21/76865* (2013.01); *H01L 21/76877* (2013.01); *H01L 23/5283* (2013.01); *H01L 23/53238* (2013.01); *H01L 29/45* (2013.01); H01L 21/283 (2013.01); H01L 21/28562 (2013.01); H01L 21/32051 (2013.01); H01L 21/76807 (2013.01); H01L 21/76834 (2013.01); H01L 21/76846 (2013.01); H01L 23/528 (2013.01); H01L 23/5226 (2013.01); H01L 23/5329 (2013.01); H01L 23/53233 (2013.01)

(58) Field of Classification Search
CPC ......... H01L 21/76846; H01L 21/76834; H01L 23/5226; H01L 21/76852
See application file for complete search history.

(56) References Cited

U.S. PATENT DOCUMENTS

| | | | |
|---|---|---|---|
| 5,968,333 A | 10/1999 | Nogami et al. | |
| 6,169,024 B1 * | 1/2001 | Hussein | H01L 21/76807 257/E21.579 |
| 6,245,655 B1 | 6/2001 | Moslehi | |
| 6,417,094 B1 * | 7/2002 | Zhao | H01L 21/76808 257/E21.579 |
| 6,483,143 B2 | 11/2002 | Matsui et al. | |
| 6,551,893 B1 | 4/2003 | Zheng et al. | |
| 6,812,110 B1 * | 11/2004 | Basceri | H01L 27/10852 257/E21.008 |
| 6,849,173 B1 * | 2/2005 | Chang | C25D 5/34 205/118 |
| 7,037,837 B2 | 5/2006 | Grunow et al. | |
| 7,282,438 B1 | 10/2007 | Yu et al. | |
| 7,391,115 B2 | 6/2008 | Usami et al. | |
| 7,663,239 B2 | 2/2010 | Ikeda et al. | |
| 7,834,457 B2 | 11/2010 | Yang et al. | |
| 7,928,569 B1 | 4/2011 | Edelstein et al. | |
| 8,025,922 B2 | 9/2011 | Haukka et al. | |
| 8,349,725 B2 * | 1/2013 | Sato | H01L 21/76861 438/627 |
| 9,123,785 B1 | 9/2015 | Duong et al. | |
| 9,224,686 B1 | 12/2015 | Chen et al. | |
| 9,711,399 B2 * | 7/2017 | Farmer | H01L 23/53238 |
| 9,837,270 B1 | 12/2017 | Varadarajan et al. | |
| 9,837,310 B2 | 12/2017 | Peng et al. | |
| 9,899,297 B1 * | 2/2018 | Chen | H01L 25/50 |
| 9,953,927 B1 | 4/2018 | Wang et al. | |
| 9,966,339 B2 * | 5/2018 | Lin | H01L 23/53295 |
| 10,157,819 B2 * | 12/2018 | Chen | H01L 21/3225 |
| 2002/0030210 A1 | 3/2002 | Matsui et al. | |
| 2002/0058163 A1 | 5/2002 | Uzoh et al. | |
| 2003/0036263 A1 | 2/2003 | Lin et al. | |
| 2004/0145062 A1 | 7/2004 | Nopper et al. | |
| 2004/0152333 A1 | 8/2004 | Zhao et al. | |
| 2004/0224467 A1 | 11/2004 | Basceri et al. | |
| 2005/0082089 A1 | 4/2005 | Grunow et al. | |
| 2005/0206000 A1 * | 9/2005 | Aggarwal | H01L 21/76846 257/758 |
| 2006/0121733 A1 | 6/2006 | Kilpela et al. | |
| 2007/0059502 A1 | 3/2007 | Wang et al. | |
| 2007/0082132 A1 | 4/2007 | Shinriki et al. | |
| 2007/0259519 A1 * | 11/2007 | Yang | C23C 14/046 438/638 |
| 2008/0102621 A1 | 5/2008 | Yoon et al. | |
| 2008/0136037 A1 | 6/2008 | Arakawa | |
| 2008/0286965 A1 * | 11/2008 | Lee | H01L 21/76849 438/643 |
| 2008/0303155 A1 | 12/2008 | Lu et al. | |
| 2008/0318417 A1 | 12/2008 | Shinriki et al. | |
| 2010/0197135 A1 | 8/2010 | Ishizaka | |
| 2011/0049718 A1 | 3/2011 | Matsumoto et al. | |
| 2014/0175652 A1 | 6/2014 | Yu et al. | |
| 2015/0102461 A1 * | 4/2015 | Lee | H01L 23/5223 257/532 |
| 2015/0221743 A1 | 8/2015 | Ho et al. | |
| 2015/0228605 A1 | 8/2015 | Lin et al. | |
| 2015/0235954 A1 * | 8/2015 | Chang | H01L 21/76862 257/751 |
| 2015/0262872 A1 | 9/2015 | Ishizaka et al. | |
| 2016/0163725 A1 | 6/2016 | Kamiya et al. | |
| 2016/0307797 A1 * | 10/2016 | Farmer | H01L 21/28088 |
| 2017/0278698 A1 | 9/2017 | Ikegawa et al. | |
| 2017/0294312 A1 | 10/2017 | O'Meara et al. | |
| 2018/0096914 A1 * | 4/2018 | Chen | H01L 21/76852 |
| 2019/0043719 A1 | 2/2019 | Takagi et al. | |

FOREIGN PATENT DOCUMENTS

| | | |
|---|---|---|
| CN | 107887326 A | 4/2018 |
| JP | 2004241464 A | 8/2004 |
| JP | 2005129831 A | 5/2005 |
| JP | 2007300113 A | 11/2007 |
| KR | 20010021194 A | 3/2001 |
| KR | 20010083146 A | 8/2001 |
| KR | 20060009003 A | 1/2006 |
| KR | 20100093138 A | 8/2010 |
| KR | 20160098201 A | 8/2016 |
| KR | 20170110020 A | 10/2017 |
| WO | 2015099734 A1 | 7/2015 |

* cited by examiner

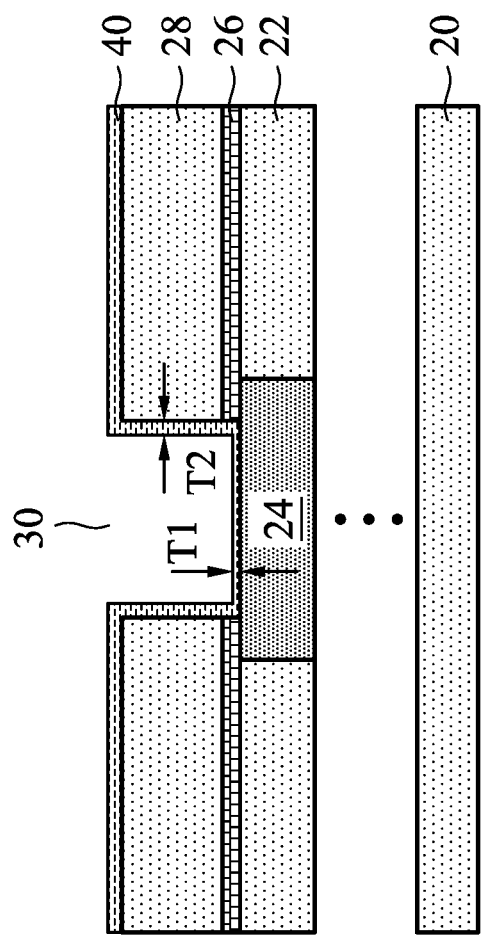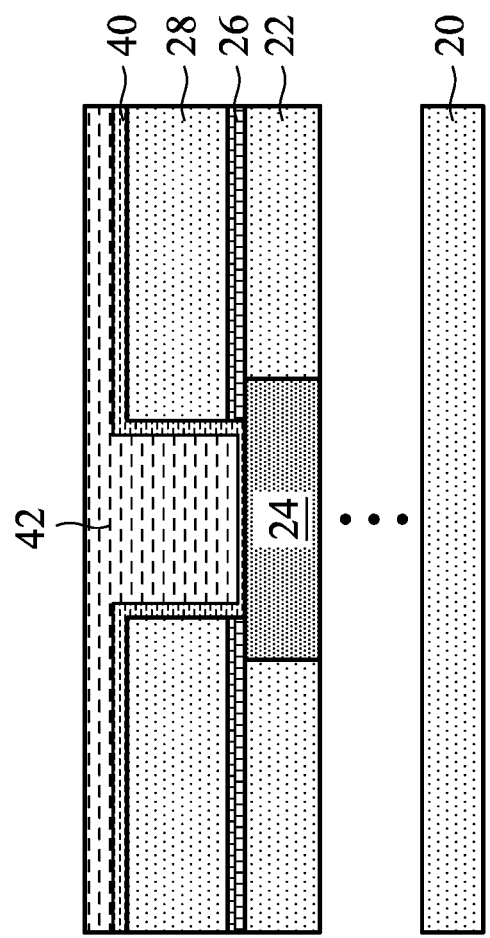
FIG. 3
FIG. 4

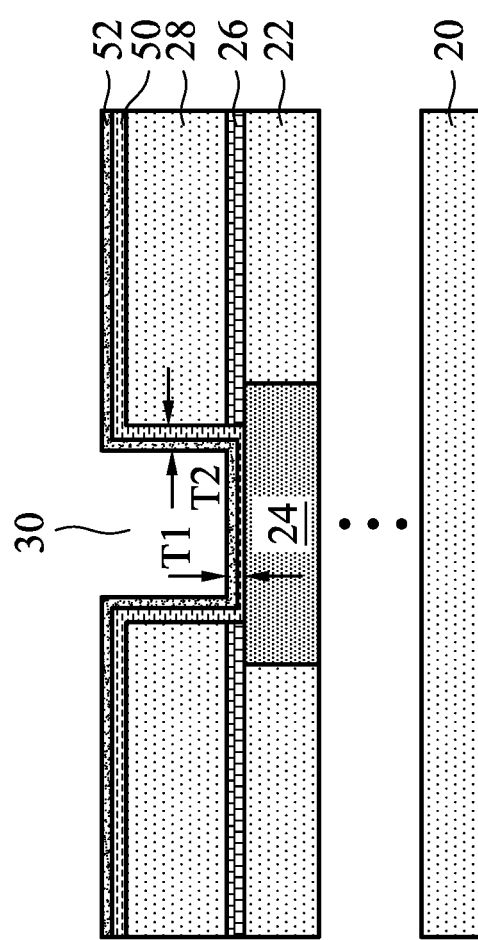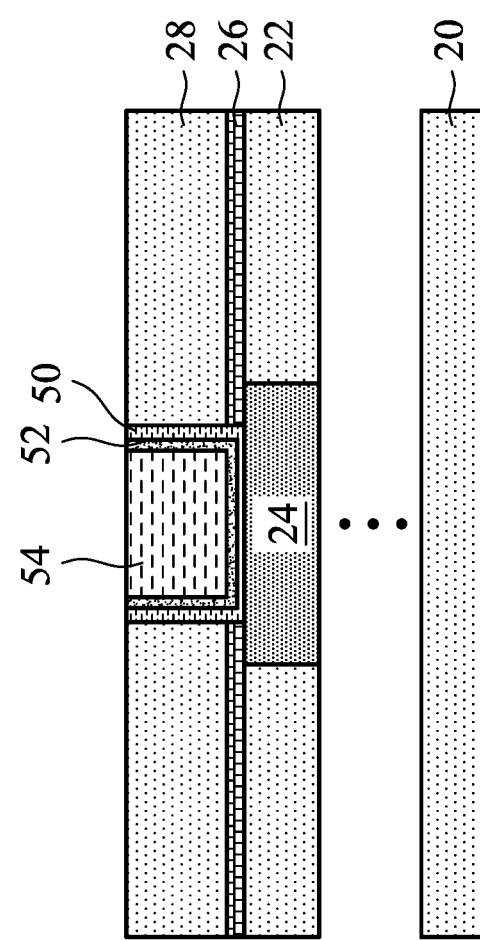
FIG. 8
FIG. 9

BARRIER LAYER FORMATION FOR CONDUCTIVE FEATURE

PRIORITY CLAIM AND CROSS-REFERENCE

This application is a continuation of U.S. application Ser. No. 15/993,751, filed on May 31, 2018, now U.S. Pat. No. 10,741,442, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 5 are cross-sectional views of respective intermediate structures during an example method for forming a conductive feature in accordance with some embodiments.

FIGS. 8 and 9 are cross-sectional views of respective intermediate structures during another example method for forming a conductive feature in accordance with some embodiments.

DETAILED DESCRIPTION

Figure 1:
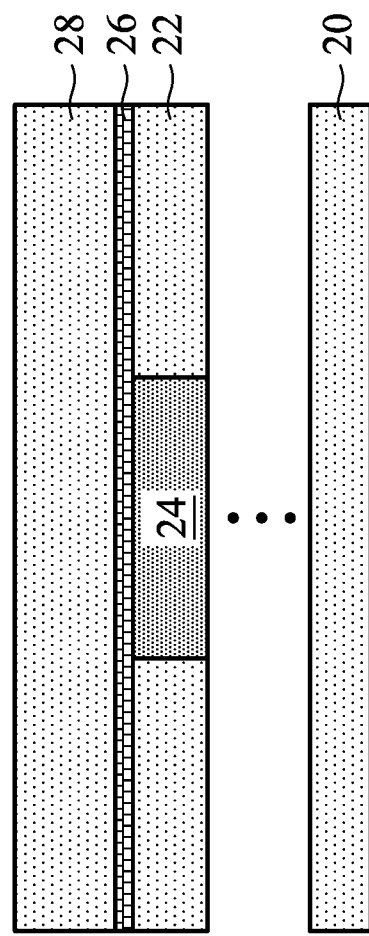

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for forming a barrier layer for a conductive feature in semiconductor processing. Generally, a deposition process, such as an atomic layer deposition (ALD), for depositing a layer may implement a precursor that has an incubation time difference dependent upon the underlying surfaces, such as a dielectric surface or a conductive (e.g., metal) surface, on which the layer is deposited. In some examples, a carbon-rich tantalum nitride precursor gas is used in an ALD process to deposit a carbon-rich tantalum nitride layer, which is used to implement a barrier layer. In some examples, the carbon-rich tantalum nitride precursor gas has a lower incubation time for depositing the carbon-rich tantalum nitride layer on a dielectric surface than for depositing the carbon-rich tantalum nitride layer on a conductive (e.g., metal) surface. Hence, the carbon-rich tantalum nitride layer can have a reduced thickness on the conductive surface compared to on the dielectric surface. These thicknesses may be advantageous to reduce a resistance to the conductive feature on which the layer is formed because of the reduced thickness, while maintaining sufficient diffusion barrier properties at the dielectric surface. Some examples can further implement, for example, a carbon-poor tantalum nitride layer with the carbon-rich tantalum nitride layer, which together are used to implement a barrier layer. Other advantages or benefits may also be achieved.

Some embodiments described herein are in the context of Back End Of the Line (BEOL) processing. Other processes and structures within the scope of other embodiments may be performed in other contexts, such as in Middle End Of the Line (MEOL) processing and other contexts. Various modifications are discussed with respect to disclosed embodiments; however, other modifications may be made to disclose embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 5 illustrate cross-sectional views of respective intermediate structures during an example method for forming a conductive feature in accordance with some embodiments. FIG. 1 illustrates a first dielectric layer 22 over a semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 20 may include elemental semiconductor like silicon (Si) and germanium (Ge); a compound semiconductor; an alloy semiconductor; or a combination thereof.

Various devices may be on the semiconductor substrate 20. For example, the semiconductor substrate 20 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Processing described herein may be used to form and/or to interconnect the devices to form an integrated circuit. The integrated circuit can be any circuit, such as for an Application Specific Integrated Circuit (ASIC), a processor, memory, or other circuit.

The first dielectric layer 22 is above the semiconductor substrate 20. The first dielectric layer 22 may be directly on the semiconductor substrate 20, or any number of other layers may be disposed between the first dielectric layer 22 and the semiconductor substrate 20. For example, the first dielectric layer 22 may be or include an Inter-Layer Dielectric (ILD) or an Inter-Metal Dielectric (IMD). The first dielectric layer 22, for example, may be or comprise a low-k dielectric having a k-value less than about 4.0, such as about 2.0 or even less. In some examples, the first dielectric layer 22 comprises phosphosilicate glass (PSG), borophosphosilicate glass (BPSG), fluorosilicate glass (FSG), $SiO_xC_y$, Spin-On-Glass, Spin-On-Polymers, silicon carbon material, a compound thereof, a composite thereof, or a combination thereof.

A conductive feature 24 is in and/or through the first dielectric layer 22. The conductive feature 24 may be or include a gate structure of a transistor, a contact plug to a gate structure of a transistor and/or to a source/drain region of a transistor, a conductive line and/or a conductive via. For example, the first dielectric layer 22 may include an ILD, and the conductive feature 24 may include a gate electrode (e.g., tungsten, cobalt, etc.) in the ILD formed using a replacement gate process, for example. In another example, the first dielectric layer 22 may be an ILD, and the conductive feature 24 may include a contact plug. The contact plug may be formed by forming an opening through the ILD to, for example, a gate electrode and/or source/drain region of a transistor formed on the semiconductor substrate 20. The contact plug can include an adhesion layer (e.g., Ti, etc.), a barrier layer (e.g., TiN, etc.) on the adhesion layer, and a conductive fill material (e.g., tungsten, cobalt, etc.) on the barrier layer. In yet another example, the first dielectric layer 22 may be an IMD, and the conductive feature 24 may include a conductive line and/or a conductive via (collectively or individually, "interconnect structure"). The interconnect structure may be formed by forming an opening and/or recess through and/or in the IMD, for example, using a damascene process. The interconnect structure can include, for example, a barrier layer (such as described herein) along sidewalls of the first dielectric layer 22 and a metal fill material (e.g., copper, etc.).

An etch stop layer (ESL) 26 is over the first dielectric layer 22 and the conductive feature 24. Generally, an ESL can provide a mechanism to stop an etch process when forming, e.g., conductive vias. An ESL may be formed of a dielectric material having a different etch selectivity from adjacent layers or components. The ESL 26 is deposited on the top surfaces of the first dielectric layer 22 and the conductive feature 24. The ESL 26 may comprise or be silicon nitride, silicon carbon nitride, silicon carbon oxide, carbon nitride, the like, or a combination thereof, and may be deposited by chemical vapor deposition (CVD), plasma enhanced CVD (PECVD), ALD, or another deposition technique.

A second dielectric layer 28 is over the ESL 26. For example, the second dielectric layer 28 may be or include an IMD. The second dielectric layer 28 is deposited on the top surface of the ESL 26. The second dielectric layer 28, for example, may be or comprise a low-k dielectric having a k-value less than about 4.0, such as about 2.0 or even less. In some examples, the second dielectric layer 28 comprises PSG, BPSG, FSG, $SiO_xC_y$, Spin-On-Glass, Spin-On-Polymers, silicon carbon material, a compound thereof, a composite thereof, or a combination thereof. The second dielectric layer 28 may be deposited using a CVD, such as PECVD or Flowable CVD (FCVD); spin-on coating; or another deposition technique. In some examples, a Chemical Mechanical Planarization (CMP) or another planarization process may be performed to planarize the top surface of second dielectric layer 28.

The configuration of FIG. 1 is an example to illustrate aspects herein. In other examples, various other layers may be included, omitted, and/or modified. A person having ordinary skill in the art will readily understand various modifications that may be made.

Figure 2:
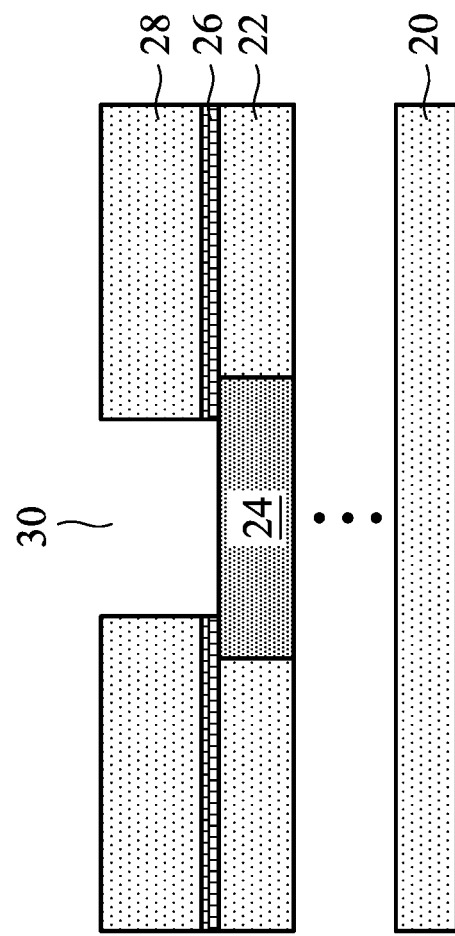

FIG. 2 illustrates the formation of an opening 30 in and/or through the ESL 26 and second dielectric layer 28 to the conductive feature 24. The opening 30 can be or include a via opening, a trench, and/or the like. The opening 30 can be formed using photolithography and etch processes, such as in a damascene process. The etch process may include a reactive ion etch (RIE), neutral beam etch (NBE), inductive coupled plasma (ICP) etch, the like, or a combination thereof. The etch process may be anisotropic.

The sidewalls of the opening 30 are illustrated as being vertical. In other examples, sidewalls of the opening 30 may taper together in a direction toward or away from the bottom of the opening 30. For example, the opening 30 may have a positive taper profile or a reentrant profile.

FIG. 3 illustrates the formation of a barrier layer 40 in the opening 30 along the sidewalls of the second dielectric layer 28 and ESL 26 and along the upper surface of the conductive feature 24. The barrier layer 40 is further formed on the upper surface of the second dielectric layer 28. Generally, in some examples, the barrier layer 40 includes tantalum nitride. A process for forming the barrier layer 40 is described in more detail below with respect to FIG. 6. As shown in FIG. 3, the barrier layer 40 has a first thickness T1 along the upper surface of the conductive feature 24 and has a second thickness T2 along the sidewalls of the second dielectric layer 28 and ESL 26. Generally, and as will become apparent from the description of FIG. 6, the second thickness T2 is greater than the first thickness T1.

FIG. 4 illustrates the formation of a conductive fill material 42 on the barrier layer 40, which fills the opening 30. The conductive fill material 42 can be or include a metal fill, such as copper, tungsten, cobalt, aluminum, ruthenium, the like, or a combination thereof. The conductive fill material 42 can be deposited by any acceptable deposition process, such as CVD, physical vapor deposition (PVD), plating (e.g., electroless plating), the like, or a combination thereof.

Figure 5:
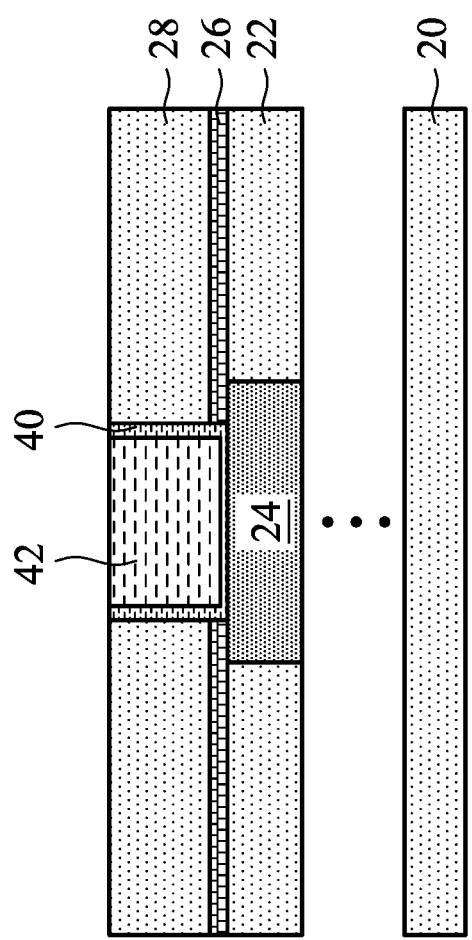

FIG. 5 illustrates the removal of excess conductive fill material 42 and barrier layer 40 to form a conductive feature (comprising the conductive fill material 42 and barrier layer 40) in the second dielectric layer 28. Excess conductive fill material 42 and barrier layer 40 can be removed using a planarization process, such as a CMP, which can form upper surfaces of the conductive fill material 42, barrier layer 40, and second dielectric layer 28 to be level. A conductive feature, such as in a damascene interconnect structure, can be formed, as illustrated in FIG. 5.

Although not illustrated in the figures, one or more additional dielectric layers may be formed over the second dielectric layer 28 and conductive feature (including the conductive fill material 42 and barrier layer 40). Additionally, an additional conductive feature, which may be formed similar to the illustrated conductive feature (including the conductive fill material 42 and barrier layer 40), can be formed in the one or more additional dielectric layers and contacting the upper surface of the illustrated conductive feature.

Figure 6:
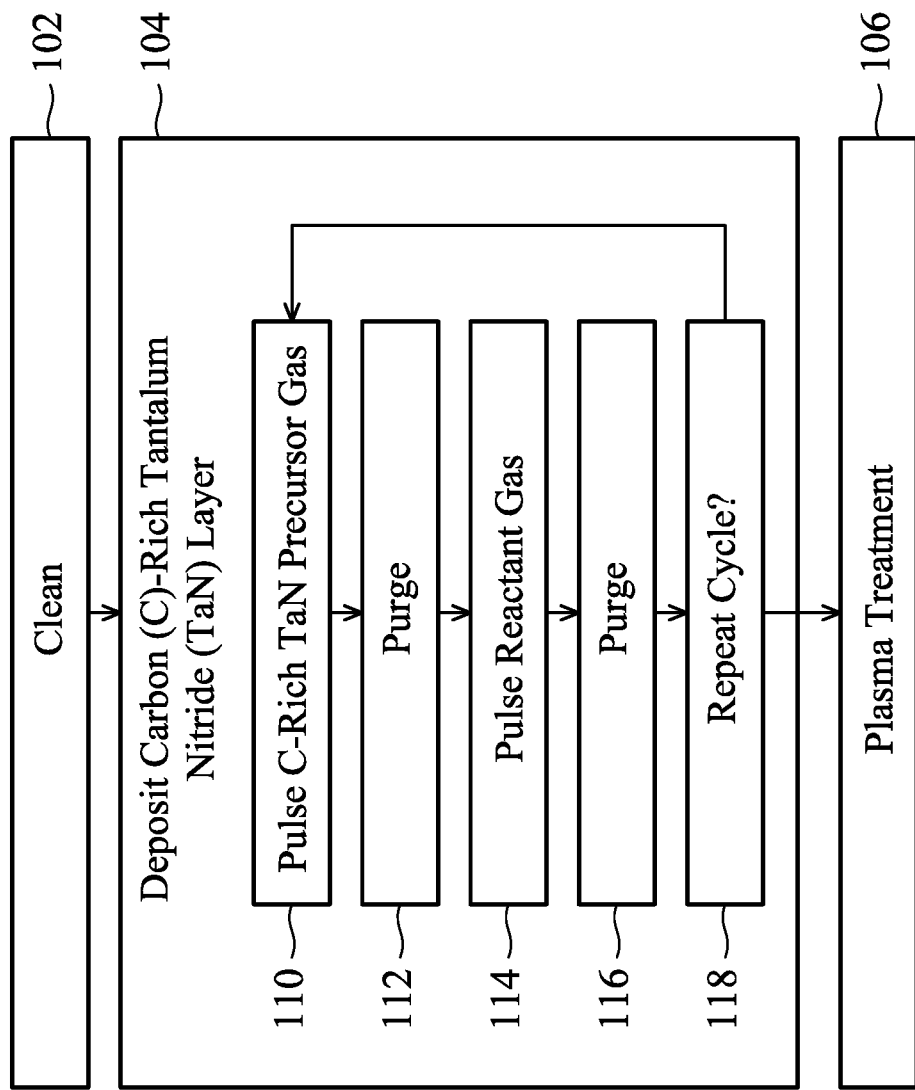
FIG. 6 is a flow chart of a method for forming a barrier layer in a conductive feature in accordance with some embodiments.

FIG. 6 is a flow chart of a method for forming the barrier layer 40 in the conductive feature in accordance with some embodiments. The method of FIG. 6 includes performing a cleaning process (operation 102), depositing a carbon-rich tantalum nitride layer (operation 104), and performing a plasma treatment (operation 106). The cleaning process, deposition, and plasma treatment may be performed in situ in a same tool chamber in some examples.

In operation 102, a cleaning process is performed on the intermediate structure of FIG. 2. The cleaning process can remove residual material from the etch process that forms the opening 30, and can remove an oxide from the top surface of the conductive feature 24. In some examples, the conductive feature 24 can be or include copper, and a copper oxide can be formed at the upper surface of the copper, for example, by the etch process of forming the opening 30, a CMP process when forming the conductive feature 24, and/or other processes. In those examples, the cleaning process can remove the copper oxide.

In some examples, the cleaning process includes exposing the intermediate structure of FIG. 2 to a plasma. The plasma can reduce an oxide formed on the conductive feature 24. The plasma can be or include a reducing gas, such as hydrogen ($H_2$). In some examples, the plasma is a remote plasma.

In operation 104, the carbon-rich tantalum nitride layer is deposited on the cleaned intermediate structure. FIG. 6 illustrates an ALD process for depositing the carbon-rich tantalum nitride layer in operation 104, although in other examples, another CVD process may be used to deposit the carbon-rich tantalum nitride layer. In conjunction with the plasma treatment of operation 106, the ALD process may be referred to as a plasma enhance ALD (PEALD). Operation 104 includes, sequentially, pulsing a carbon-rich tantalum nitride precursor gas (operation 110) in a chamber, purging (operation 112) the chamber, pulsing a reactant gas (operation 114) in the chamber, and purging (operation 116) the chamber. In other examples, the order of the operations 110, 112, 114, and 116 may be altered, such as operation 114 being performed before operation 110. Operations 110, 112, 114, and 116 create a cycle of the ALD process. At operation 118, a determination is made whether another cycle is to be repeated, and if so, the cycle beginning at operation 110 is performed again. The cycle can be repeated until a predetermined number of cycles have been performed to achieve a target thickness of the carbon-rich tantalum nitride layer. In some examples, a number of cycles to be performed is in a range from 10 cycles to 30 cycles, for example.

The ALD process can be performed in a chamber with a pressure in a range from about 2 Torr to about 5 Torr, and with a temperature in a range from about 250° C. to about 350° C., and more particularly, from about 275° C. to about 325° C. A soak time for each pulse (operations 110, 114) can be in a range from about 0.5 seconds to about 10 seconds. A duration for each purge (operations 112, 116) can be in a range from about 0.5 seconds to about 10 seconds.

The carbon-rich tantalum nitride precursor gas for operation 110 can be or include Ta,[(3,4-eta)-alkyne] tris (N,N-alkylaminato) ($Ta[N(CH_3)_2]_3(C_6H_{10})$), $Ta[N(C_2H_5)_2]_3NC(CH_3)_3$, and/or the like. In some examples, the carbon-rich tantalum nitride precursor gas can have a concentration of carbon of equal to or greater than about 25 atomic percentage (at. %), such as in a range from about 25 at. % to about 40 at. %. The reactant gas for operation 114 can be or include ammonia ($NH_3$), hydrazine ($N_2H_2$), and/or the like. The carbon-rich tantalum nitride precursor gas and the reactant gas for operations 110, 114, respectively, can be mixed with a carrier gas, which can be inert, such as argon (Ar). Further, a gas for the purges of operations 112, 116 can be an inert gas, such as argon (Ar).

Figure 7:
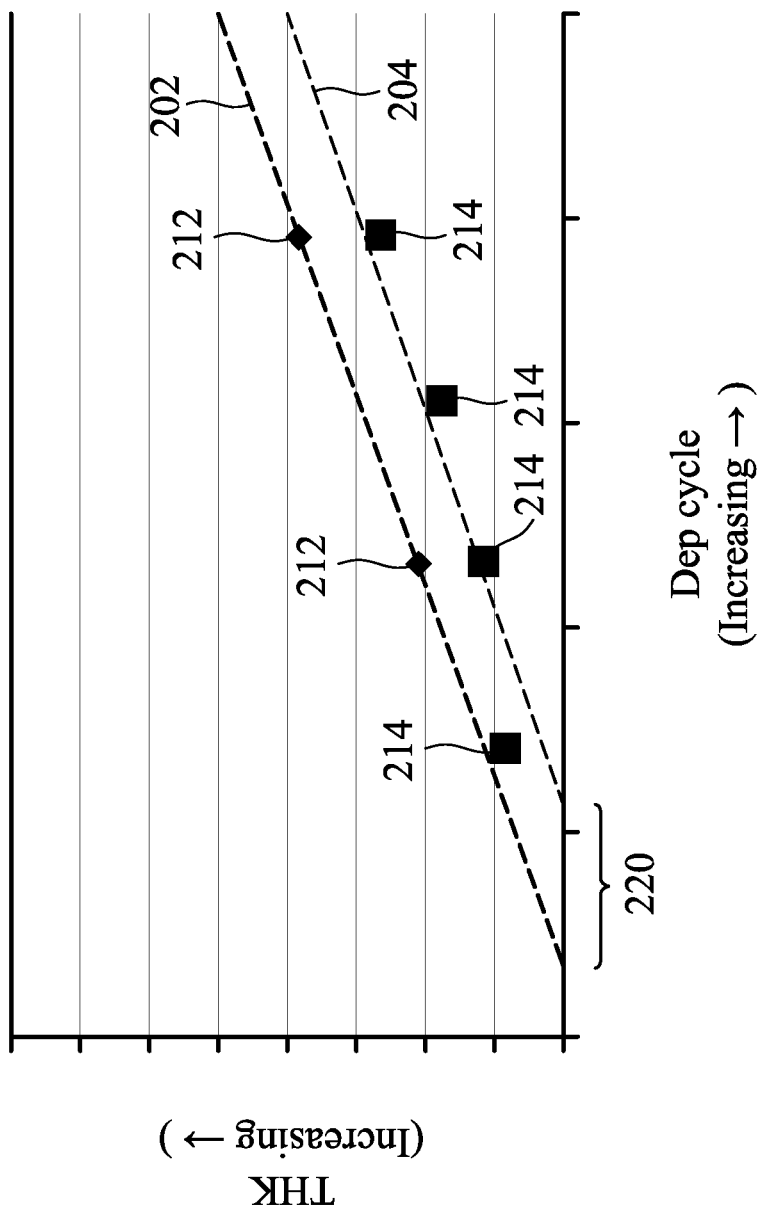
FIG. 7 is a graph illustrating aspects of formation of a barrier layer in a conductive feature in accordance with some embodiments.

Using the example ALD process in operation 104, a carbon-rich tantalum nitride layer can be deposited with a varying thickness dependent upon the surface on which the layer is deposited. In some examples, the carbon-rich tantalum nitride layer, as deposited, has a greater thickness on dielectric surfaces (e.g., sidewalls of the second dielectric layer 28 and ESL 26 in FIG. 3) compared to metallic surfaces (e.g., upper surface of the conductive feature 24 in FIG. 3). FIG. 7 illustrates aspects of this difference in thicknesses. FIG. 7 is a graph illustrating the thickness of a deposited layer as a function of number of deposition cycles. A first fitted-line 202 based on experimental first data points 212 shows the thickness of the carbon-rich tantalum nitride layer deposited on a surface of a low-k dielectric (e.g., a $SiO_xC_y$ material), and a second fitted-line 204 based on experimental second data points 214 shows the thickness of the carbon-rich tantalum nitride layer deposited on a surface of a metal (e.g., Cu). Deposition on the surface of the metal is shown to be delayed relative to deposition on the surface of the low-k dielectric, which is believed to be due to a longer incubation time for deposition on the surface of the metal compared to the surface of the low-k dielectric. An incubation time difference 220 is illustrated in FIG. 7 illustrating the longer incubation time. In some examples, the incubation time difference 220 may result in a difference between a thickness on the surface of the low-k dielectric and a thickness on a surface of a metal being in a range from about 4 Å to about 6 Å. After the incubation time has elapsed for the surfaces, deposition is at substantially the same rate (e.g., within about 3% of each other, such as less than about 2.1%) regardless of the underlying surface.

It is believed that the carbon-rich tantalum nitride precursor gas has a larger steric hindrance that reduces adsorption on the metal (e.g., Cu) compared to carbon-poor tantalum nitride precursor gases. The large organic (e.g., C-containing) groups of the carbon-rich tantalum nitride precursor gas can provide a repulsive force from the metal that may not be present with carbon-poor tantalum nitride precursor gases. Further, the low-k dielectric (e.g., $SiO_xC_y$)

may have a lower adsorption activation energy compared to the metal (e.g., Cu) that permits the carbon-rich tantalum nitride precursor gas to react more with the low-k dielectric in earlier cycles of the ALD process.

In operation 106, the carbon-rich tantalum nitride layer deposited in operation 104 is treated using a plasma process. The plasma process can remove organic impurities. The plasma process can also densify the carbon-rich tantalum nitride layer, which can improve diffusion barrier properties of the layer. In some examples, the plasma process implements a capacitively coupled plasma (CCP). The plasma process can use hydrogen ($H_2$) gas with a carrier gas, such as argon (Ar). The flow rate of the hydrogen gas can be in a range from about 50% to about 95% of the total flow of gases (e.g., combined flow of hydrogen and carrier gas). A pressure of the plasma process can be in a range from about 1 Torr to about 5 Torr. A temperature of the plasma process can be in a range from about 250° C. to about 350° C., which may be equal to the temperature used for the deposition in operation 104. A power of the plasma generator of the plasma process can be in a range from about 100 W to about 800 W and a frequency of the plasma generator can be about 13.56 MHz, in a range from about 20 MHz to about 40 MHz, or another frequency. A duration of the treatment by the plasma process can be in a range from about 5 seconds to about 120 seconds.

The carbon-rich tantalum nitride layer can adsorb and/or react with the plasma to deplete the carbon-rich tantalum nitride layer of carbon and to densify the carbon-rich tantalum nitride layer. As deposited, the carbon-rich tantalum nitride layer can have a concentration of carbon of equal to or greater than about 15 at. %, such as in a range from about 15 at. % to about 35 at. % (e.g., about 20 at. %). A density of the carbon-rich tantalum nitride layer, as deposited, can be in a range from about 5 $g/cm^3$ to about 7 $g/cm^3$. After the plasma treatment, carbon from the carbon-rich tantalum nitride layer may be depleted, and hence, after the plasma treatment the carbon-rich tantalum nitride layer may be referred to as a tantalum nitride layer, which may be carbon-poor. Further, the tantalum nitride layer may be more dense than the as-deposited carbon-rich tantalum nitride layer. After the plasma treatment, the tantalum nitride layer can have a concentration of carbon in a range from about 1 at. % to about 5 at. %. A density of the tantalum nitride layer, after the plasma treatment, can be in a range from about 11.0 $g/cm^3$ to about 12.0 $g/cm^3$. After the plasma treatment, the tantalum nitride layer that is formed can be the barrier layer 40 of FIG. 3.

As stated previously, the first thickness T1 of the barrier layer 40 on the upper surface of the conductive feature 24 is less than the second thickness T2 of the barrier layer 40 on the sidewalls of the second dielectric layer 28. The difference between the thicknesses T1, T2 can be caused largely by the difference in incubation time during the deposition in operation 104 of FIG. 6. In a particular example, the first thickness T1 can be in a range from about 14 Å to about 16 Å, and the second thickness T2 can be about 20 Å. Hence, in this particular example, the first thickness T1 can be less than the second thickness T2 by an amount in a range from about 20% to about 30% of the second thickness T2. In other examples, the difference expressed as a percentage can vary depending on, e.g., the second thickness T2. As described previously, after the incubation period difference, the carbon-rich tantalum nitride layer can be deposited at substantially the same rate on, e.g., the conductive feature 24 and on the second dielectric layer 28. Hence, the difference between the thicknesses T1, T2 may remain substantially the same although the barrier layer 40 may be formed at various thicknesses, and as, e.g., the second thickness T2 increases, the difference between the thicknesses T1, T2 becomes less of a percentage of the second thickness T2.

The differing thicknesses T1, T2 can enable beneficial barrier properties of the barrier layer 40 for the second dielectric layer 28 while reducing resistance between the conductive feature 24 and the conductive fill material 42. Generally, the thinner the barrier layer 40 is between the conductive feature 24 and the conductive fill material 42, the lower the resistance is between the conductive feature 24 and the conductive fill material 42. Conversely, the thicker the barrier layer 40 is between the conductive fill material 42 and the second dielectric layer 28, the better the barrier layer 40 may prevent diffusion of the conductive fill material 42 into the second dielectric layer 28. Hence, the barrier layer 40 can enable achieving a lower resistance by having a thinner first thickness T1 along the conductive feature 24 and can enable beneficial barrier properties by having a thicker second thickness T2 along the sidewall of the second dielectric layer 28.

Examples described below implement a barrier layer using a deposited differential carbon-concentration tantalum nitride layer. A differential carbon-concentration tantalum nitride layer can be implemented by multiple (e.g., two or more) sub-layers (e.g., multilayer) and/or by a gradient layer. In a multilayer implementation, each of multiple sub-layers can be deposited with different concentrations of carbon, which respective concentration of carbon is substantially uniform throughout the sub-layer, by using different ones or different mixtures of a carbon-rich tantalum nitride precursor gas and a carbon-poor tantalum nitride precursor gas. In a gradient layer implementation, a gradient layer can be deposited with a substantially continuous gradient concentration of carbon by using different ones or different mixtures of a carbon-rich tantalum nitride precursor gas and a carbon-poor tantalum nitride precursor gas.

FIGS. 8 and 9 illustrate cross-sectional views of respective intermediate structures during an example method for forming a conductive feature in accordance with some embodiments. FIG. 8 shows the semiconductor substrate 20, first dielectric layer 22, conductive feature 24, ESL 26, second dielectric layer 28, and opening 30 as described with respect to FIGS. 1 and 2 above.

FIG. 8 further illustrates the formation of a barrier layer in the opening 30 along the sidewalls of the second dielectric layer 28 and ESL 26 and along the upper surface of the conductive feature 24. The barrier layer is further formed on the upper surface of the second dielectric layer 28. The barrier layer is implemented by, among other things, depositing a first sub-layer 50 and a second sub-layer 52 over the first sub-layer 50. Generally, in some examples, the barrier layer includes tantalum nitride. A process for forming the barrier layer, which includes depositing the first sub-layer 50 and the second sub-layer 52, is described in more detail below with respect to FIG. 12. As shown in FIG. 8, the barrier layer has a first thickness T1 along the upper surface of the conductive feature 24 and has a second thickness T2 along the sidewalls of the second dielectric layer 28 and ESL 26. Generally, and as will become apparent from the description of FIG. 12, the second thickness T2 is greater than the first thickness T1.

FIG. 9 illustrates the formation of a conductive fill material 54 on the barrier layer, which fills the opening 30, and the removal of any excess conductive fill material 54 and barrier layer. The conductive fill material 54 can be or include a metal fill, such as copper, tungsten, cobalt, aluminum, ruthenium, the like, or a combination thereof. The conductive fill material 54 can be deposited by any acceptable deposition process, such as CVD, PVD, plating (e.g., electroless plating), the like, or a combination thereof. Excess conductive fill material 54 and barrier layer can be removed using a planarization process, such as a CMP, which can form upper surfaces of the conductive fill material 54, barrier layer, and second dielectric layer 28 to be level. A conductive feature, such as in a damascene interconnect structure, can be formed, as illustrated in FIG. 9.

Figure 10:
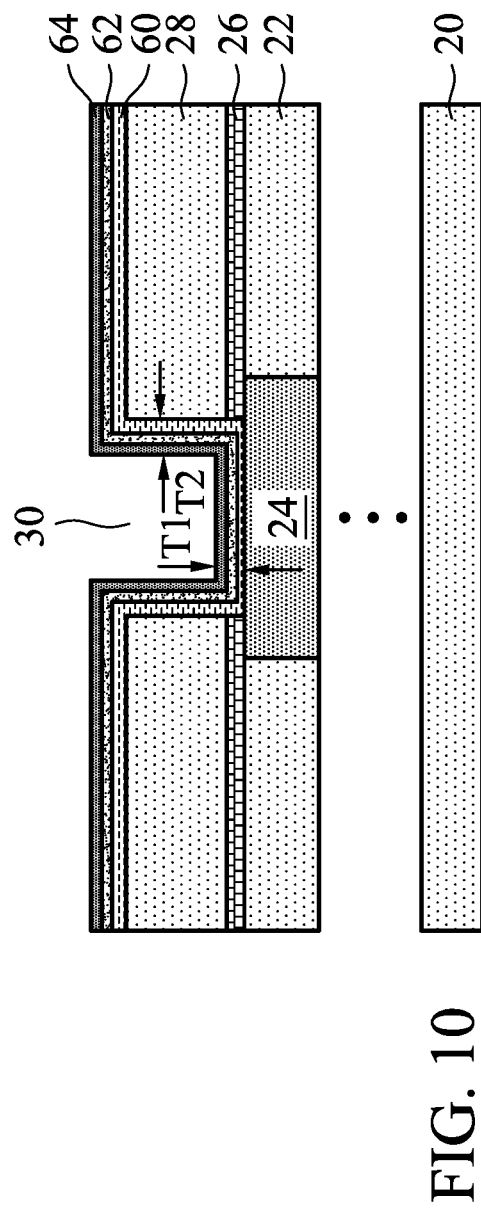
FIGS. 10 and 11 are cross-sectional views of respective intermediate structures during another example method for forming a conductive feature in accordance with some embodiments.
Figure 11:
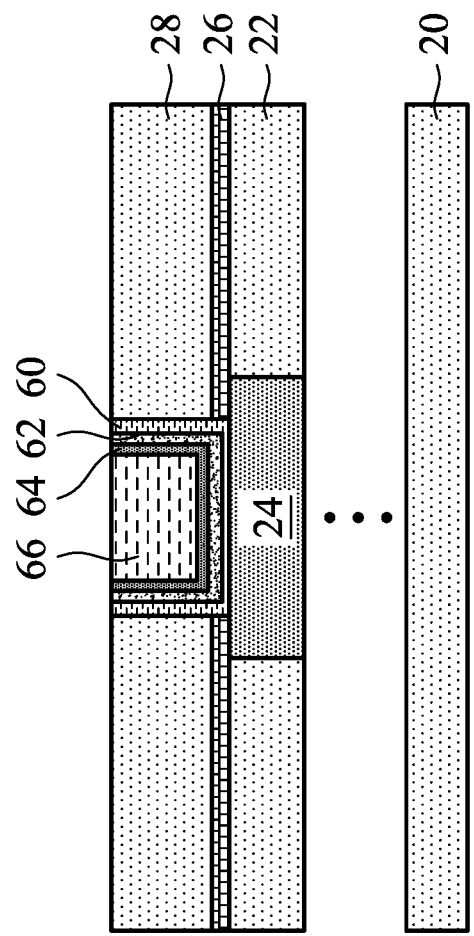

FIGS. 10 and 11 illustrate cross-sectional views of respective intermediate structures during an example method for forming a conductive feature in accordance with some embodiments. FIG. 10 shows the semiconductor substrate 20, first dielectric layer 22, conductive feature 24, ESL 26, second dielectric layer 28, and opening 30 as described with respect to FIGS. 1 and 2 above.

FIG. 10 further illustrates the formation of a barrier layer in the opening 30 along the sidewalls of the second dielectric layer 28 and ESL 26 and along the upper surface of the conductive feature 24. The barrier layer is further formed on the upper surface of the second dielectric layer 28. The barrier layer is implemented by, among other things, depositing a first sub-layer 60, a second sub-layer 62 over the first sub-layer 60, and a third sub-layer 64 over the second sub-layer 62. Generally, in some examples, the barrier layer includes tantalum nitride. A process for forming the barrier layer, which includes depositing the first sub-layer 60, the second sub-layer 62, and the third sub-layer 64, is described in more detail below with respect to FIG. 12. As shown in FIG. 10, the barrier layer has a first thickness T1 along the upper surface of the conductive feature 24 and has a second thickness T2 along the sidewalls of the second dielectric layer 28 and ESL 26. Generally, and as will become apparent from the description of FIG. 12, the second thickness T2 is greater than the first thickness T1.

FIG. 11 illustrates the formation of a conductive fill material 66 on the barrier layer, which fills the opening 30, and the removal of any excess conductive fill material 66 and barrier layer. The conductive fill material 66 can be or include a metal fill, such as copper, tungsten, cobalt, aluminum, ruthenium, the like, or a combination thereof. The conductive fill material 66 can be deposited by any acceptable deposition process, such as CVD, PVD, plating (e.g., electroless plating), the like, or a combination thereof. Excess conductive fill material 66 and barrier layer can be removed using a planarization process, such as a CMP, which can form upper surfaces of the conductive fill material 66, barrier layer, and second dielectric layer 28 to be level. A conductive feature, such as in a damascene interconnect structure, can be formed, as illustrated in FIG. 11.

Figure 12:
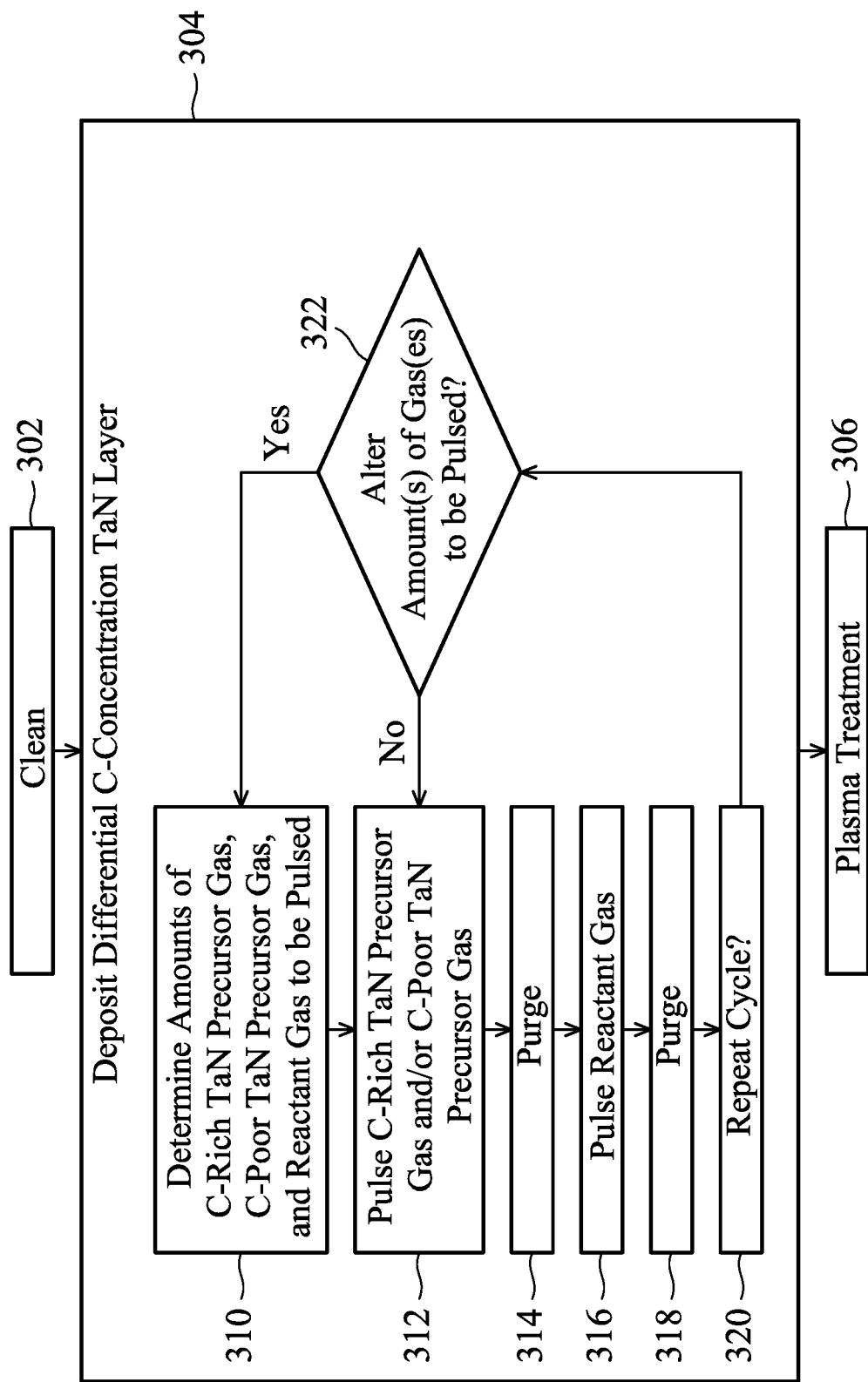
FIG. 12 is a flow chart of a method for forming a barrier layer in a conductive feature in accordance with some embodiments.

FIG. 12 is a flow chart of a method for forming the barrier layer of FIG. 8 and to in the conductive feature in accordance with some embodiments. The method of FIG. 12 includes performing a cleaning process (operation 302), depositing a differential carbon-concentration tantalum nitride layer (operation 304), and performing a plasma treatment (operation 306). The cleaning process, deposition, and plasma treatment may be performed in situ in a same tool chamber in some examples. The cleaning process and plasma treatment can be the same as or similar to the cleaning process (operation 102) and plasma treatment (operation 106) of FIG. 6, respectively, and hence, details of these processes are omitted here for brevity.

Operation 304 deposits a differential carbon-concentration tantalum nitride layer that has a varying concentration of carbon therein. In some examples, the differential carbon-concentration tantalum nitride layer can be multiple sub-layers each having substantially uniform but different concentrations of carbon (e.g., having step increases or decreases in the concentration of carbon). In some examples, the differential carbon-concentration tantalum nitride layer can be a layer having a substantially continuous gradient concentration of carbon. In some examples, the differential carbon-concentration tantalum nitride layer can have a combination of one or more sub-layers and a substantially continuous gradient (e.g., one or more sub-layers each having a uniform concentration while one or more sub-layers each have a gradient concentration).

In operation 304, the differential carbon-concentration tantalum nitride layer is deposited on the cleaned intermediate structure (as described with respect to FIG. 6). FIG. 12 illustrates an ALD process for depositing the differential carbon-concentration tantalum nitride layer in operation 304, although in other examples, another CVD process may be used to deposit the differential carbon-concentration tantalum nitride layer. Operation 304 includes, among other operations, sequentially, pulsing one or a mixture of a carbon-rich tantalum nitride precursor gas and a carbon-poor tantalum nitride precursor gas (operation 312) in a chamber, purging (operation 314) the chamber, pulsing a reactant gas (operation 316) in the chamber, and purging (operation 318) the chamber. In other examples, the order of the operations 312, 314, 316, and 318 may be altered, such as operation 316 being performed before operation 312. Operations 312, 314, 316, and 318 create a cycle of the ALD process.

Before an initial cycle is performed, at operation 310, initial amounts or flow rates of the carbon-rich tantalum nitride precursor gas, carbon-poor tantalum nitride precursor gas, and reactant gas to be subsequently pulsed are determined. The determination at operation 310 can be based on a recipe of the ALD process, which can implement a desired differential carbon-concentration tantalum nitride layer according to various design considerations, some of which are described below. After the determination at operation 310 is made, a cycle, including operations 312, 314, 316, and 318, is performed. At operation 320, a determination is made whether another cycle is to be repeated. If so, a determination is made in operation 322 as to whether any of the amounts of the precursor gases and/or reactant gas is to be altered for the subsequent cycle. The determination of operation 322 can likewise be based on the recipe. If the amounts are to be altered from the determination of operation 322, then, in operation 310, amounts or flow rates of the carbon-rich tantalum nitride precursor gas, carbon-poor tantalum nitride precursor gas, and reactant gas to be subsequently pulsed are determined, and another cycle is performed using the determined amounts. If the amounts are not to be altered from the determination of operation 322, then, another cycle is performed using the amounts previously determined and implemented in the preceding cycle. A pre-determined number of cycles can be performed to achieve a target thickness of the differential carbon-concentration tantalum nitride layer.

The ALD process can be performed in a chamber with a pressure in a range from about 2 Torr to about 5 Torr, and with a temperature in a range from about 250° C. to about 350° C., and more particularly, from about 275° C. to about 325° C., such as at 300° C. A soak time for each pulse (operations 312, 316) can be in a range from about 0.5 seconds to about 10 seconds. A duration for each purge (operations 314, 318) can be in a range from about 0.5 seconds to about 10 seconds.

The carbon-rich tantalum nitride precursor gas for operation 312 can be or include Ta,[(3,4-eta)-alkyne] tris (N,N-alkylaminato) (Ta[N(CH$_3$)$_2$]$_3$(C$_6$H$_{10}$)), Ta[N(C$_2$H$_5$)$_2$]$_3$NC(CH$_3$)$_3$, and/or the like. In some examples, the carbon-rich tantalum nitride precursor gas can have a concentration of carbon of equal to or greater than about 25 at. %, such as in a range from about 25 at. % to about 40 at. %. The carbon-poor tantalum nitride precursor gas for operation 312 can be or include Ta[N(CH$_3$)$_2$]$_5$ and/or the like. In some examples, the carbon-poor tantalum nitride precursor gas can have a concentration of carbon of less than about 25 at. %, such as in a range from about 15 at. % to less than about 25 at. %. The reactant gas for operation 316 can be or include ammonia (NH$_3$), hydrazine (N$_2$H$_2$), and/or the like. The carbon-rich tantalum nitride precursor gas, carbon-poor tantalum nitride precursor gas, and the reactant gas for operations 312, 316 can be mixed with a carrier gas, which can be inert, such as argon (Ar). Further, a gas for the purges of operations 314, 318 can be an inert gas, such as argon (Ar).

An implementation of operation 304 is first described to achieve the barrier layer of FIGS. 8 and 9. In operation 304, a first number of cycles is performed using the carbon-rich tantalum nitride precursor gas, with no carbon-poor tantalum nitride precursor gas, to deposit the first sub-layer 50. Additionally, the reactant gas may be pulsed in the first number of cycles at a low percentage amount, such as equal to or less than 10% of the total flow (e.g., flow of the combined reactant gas and carrier gas). By performing this first number of cycles with the carbon-rich tantalum nitride precursor gas without the carbon-poor tantalum nitride precursor gas, the incubation time difference described with respect to FIGS. 6 and 7 may be used to deposit the first sub-layer 50 (e.g., a carbon-rich tantalum nitride layer) with different thicknesses on the upper surface of the conductive feature 24 and on sidewalls of the second dielectric layer 28. In some examples, the first number of cycles permits the incubation time difference to elapse and permits the first sub-layer 50 to begin growing on the upper surface of the conductive feature 24. Hence, in such examples, a maximum difference in thicknesses of the first sub-layer 50 (e.g., on the conductive feature 24 versus on the second dielectric layer 28) can be achieved. In other examples, the first number of cycles may not be sufficient to permit the incubation time difference to elapse.

To relate the deposition of the first sub-layer 50 to operation 304 more specifically, at operation 310, the amounts of the precursor gases are determined to be 100% carbon-rich tantalum nitride precursor gas and 0% carbon-poor tantalum nitride precursor gas as the precursor gas (e.g., without considering the carrier gas) to be pulsed in operation 312, and the amount of the reactant gas is determined to be equal to or less than 10% of the total flow (e.g., flow of the combined reactant gas and carrier gas) to be pulsed in operation 316. The cycle (operations 312, 314, 316, 318) is repeated the first number of cycles by operation 320, without the gases being altered by operation 322.

Further in operation 304 after the performance of the first number of cycles, a second number of cycles is performed using the carbon-poor tantalum nitride precursor gas, with no carbon-rich tantalum nitride precursor gas, to deposit the second sub-layer 52 (e.g., a carbon-poor tantalum nitride layer). Additionally, the reactant gas may be pulsed in the second number of cycles at a high percentage amount, such as in a range from about 10% to about 99% of the total flow (e.g., flow of the combined reactant gas and carrier gas). In some examples, the deposition using the carbon-poor tantalum nitride precursor gas generally does not exhibit the selectivity that can occur with the carbon-rich tantalum nitride precursor gas as described above. More particularly, in those examples, there is generally no significant incubation time difference and no significant difference in deposition rate based on the underlying surface on which the layer is deposited. Hence, the deposition of the second sub-layer 52 can be substantially uniform and conformal. The second number of cycles can be sufficient to form the second sub-layer 52 with a desired thickness.

To relate the deposition of the second sub-layer 52 to operation 304 more specifically, after the completion of the first number of cycles, at operation 320, a determination is made to repeat the cycle to initiate the second number of cycles. At operation 322, a determination is made that the amounts of the gases are to be altered. In response, at operation 310, the amounts of the precursor gases are determined to be 0% carbon-rich tantalum nitride precursor gas and 100% carbon-poor tantalum nitride precursor gas as the precursor gas (e.g., without considering the carrier gas) to be pulsed in operation 312, and the amount of the reactant gas is determined to be in a range from about 10% to about 99% of the total flow (e.g., flow of the combined reactant gas and carrier gas) to be pulsed in operation 316. The cycle (operations 312, 314, 316, 318) is repeated the second number of cycles by operation 320, without the gases subsequently being altered by operation 322. At the conclusion of the second number of cycles, at operation 320, a determination is made that a cycle is to be not repeated, and then, operation 306 is performed.

In operation 306, the differential carbon-concentration tantalum nitride layer deposited in operation 304 is treated using a plasma process. Generally, the plasma process can remove organic impurities and can also densify the differential carbon-concentration tantalum nitride layer.

The differential carbon-concentration tantalum nitride layer can adsorb and/or react with the plasma to deplete the differential carbon-concentration tantalum nitride layer of carbon and to densify the differential carbon-concentration tantalum nitride layer. The carbon-rich tantalum nitride layer (e.g., first sub-layer 50), which has a greater concentration of carbon than the carbon-poor tantalum nitride layer (e.g., second sub-layer 52) can slow or retard the penetration of the plasma during the plasma treatment in operation 306, which can prevent some carbon depletion and damage of the second dielectric layer 28 (e.g., a low-k dielectric layer).

As deposited, the carbon-rich tantalum nitride layer can have a concentration of carbon equal to or greater than about 15 at. %, such as in a range from about 15 at. % to about 35 at. % (e.g., about 20 at. %), and the carbon-poor tantalum nitride layer can have a concentration of carbon less than about 15 at. %, such as in a range from about 1 at. % to less than about 15 at. % (e.g., about 5 at. %). A density of the carbon-rich tantalum nitride layer, as deposited, can be in a range from about 5 g/cm$^3$ to about 7 g/cm$^3$, and a density of the carbon-poor tantalum nitride layer, as deposited, can be in a range from about 8 g/cm$^3$ to about 10 g/cm$^3$. After the plasma treatment, carbon from the carbon-rich tantalum nitride layer and the carbon-poor tantalum nitride layer may be depleted, and hence, after the plasma treatment the carbon-rich tantalum nitride layer and the carbon-poor tantalum nitride layer together may be referred to as a tantalum nitride layer, which may be carbon-poor. Further, the tantalum nitride layer may be denser than the as-deposited respective sub-layers. After the plasma treatment, the first sub-layer 50 of the tantalum nitride layer can have a concentration of carbon in a range from about 1 at. % to about 5 at. %, and the second sub-layer 52 of the tantalum nitride layer can have a concentration of carbon in a range from about 1 at. % to about 3 at. %. For example, the first sub-layer 50 may have a greater concentration of carbon than the second sub-layer 52. A density of the first sub-layer 50 of the tantalum nitride layer, after the plasma treatment, can be in a range from about 10.5 g/cm$^3$ to about 11.5 g/cm$^3$, and a density of the second sub-layer 52 of the tantalum nitride layer, after the plasma treatment, can be in a range from about 11.5 g/cm$^3$ to about 12.5 g/cm$^3$. For example, the second sub-layer 52 may be denser than the first sub-layer 50. A density of the tantalum nitride layer (e.g., comprising the first sub-layer 50 and the second sub-layer 52) can be in a range from about 11.0 g/cm$^3$ to about 12.0 g/cm$^3$. After the plasma treatment, the tantalum nitride layer that is formed can be the barrier layer of FIG. 8.

As stated previously, the first thickness T1 of the barrier layer on the upper surface of the conductive feature 24 is less than the second thickness T2 of the barrier layer on the sidewalls of the second dielectric layer 28. The difference between the thicknesses T1, T2 can be caused largely by the difference in incubation time during the deposition of the first sub-layer 50 in operation 304 of FIG. 12. In a particular example, the first thickness T1 can be about 11.5 Å, and the second thickness T2 can be about 17.5 Å. Hence, in this particular example, the first thickness T1 can be less than the second thickness T2 by an amount of about 34% of the second thickness T2. In other examples, the difference expressed as a percentage can vary depending on, e.g., the second thickness T2, similar to what was described previously. More particularly, the thickness of the first sub-layer 50 at the first thickness T1 can be about 1.5 Å, and the thickness of the first sub-layer 50 at the second thickness T2 can be about 7.5 Å. The thickness of the second sub-layer 52 can substantially uniformly be about 10 Å.

Forming a barrier layer by depositing a differential carbon-concentration tantalum nitride layer comprising a carbon-rich tantalum nitride layer and a carbon-poor tantalum nitride layer can enable beneficial barrier properties while reducing resistance between the conductive feature 24 and the conductive fill material 42. Generally, the thicknesses T1, T2 can enable the reduced resistance and beneficial barrier properties as described previously. Further, implementing a sub-layer by depositing a carbon-poor tantalum nitride layer can achieve better barrier properties because of a greater density that may be achieved, while implementing a sub-layer by depositing a carbon-rich tantalum nitride layer can reduce or mitigate damage and carbon depletion in the second dielectric layer 28 (e.g., a low-k dielectric) that might otherwise be caused by the plasma treatment.

An implementation of operation 304 is next described to achieve the barrier layer of FIGS. 10 and 11. In operation 304, a first number of cycles is performed using the carbon-rich tantalum nitride precursor gas, with no carbon-poor tantalum nitride precursor gas, to deposit the first sub-layer 60. Additionally, the reactant gas may be pulsed in the first number of cycles at a low percentage amount, such as equal to or less than 10% of the total flow (e.g., flow of the combined reactant gas and carrier gas). By performing this first number of cycles with the carbon-rich tantalum nitride precursor gas without the carbon-poor tantalum nitride precursor gas, the incubation time difference described with respect to FIGS. 6 and 7 may be used to deposit the first sub-layer 60 (e.g., a carbon-rich tantalum nitride layer) with different thicknesses on the upper surface of the conductive feature 24 and on sidewalls of the second dielectric layer 28.

In some examples, the first number of cycles permits the incubation time difference to elapse and permits the first sub-layer 60 to begin growing on the upper surface of the conductive feature 24. Hence, in such examples, a maximum difference in thicknesses of the first sub-layer 60 (e.g., on the conductive feature 24 versus on the second dielectric layer 28) can be achieved. In other examples, the first number of cycles may not be sufficient to permit the incubation time difference to elapse.

To relate the deposition of the first sub-layer 60 to operation 304 more specifically, at operation 310, the amounts of the precursor gases are determined to be 100% carbon-rich tantalum nitride precursor gas and 0% carbon-poor tantalum nitride precursor gas as the precursor gas (e.g., without considering the carrier gas) to be pulsed in operation 312, and the amount of the reactant gas is determined to be equal to or less than 10% of the total flow (e.g., flow of the combined reactant gas and carrier gas) to be pulsed in operation 316. The cycle (operations 312, 314, 316, 318) is repeated the first number of cycles by operation 320, without the gases being altered by operation 322.

Further in operation 304 after the performance of the first number of cycles, a second number of cycles is performed using a mixture of the carbon-poor tantalum nitride precursor gas and the carbon-rich tantalum nitride precursor gas, to deposit the second sub-layer 62 (e.g., a carbon-moderate tantalum nitride layer). For example, the mixture may include about equal amounts by volume or flow of the carbon-rich tantalum nitride precursor gas and the carbon-poor tantalum nitride precursor gas. Additionally, the reactant gas may be pulsed in the second number of cycles at any percentage amount of the total flow (e.g., flow of the combined reactant gas and carrier gas). Varying the amount of the reactant gas can vary the concentration of carbon in the deposited sub-layer. Generally, and assuming other conditions are the same, the greater the flow of the reactant gas is, the lower the concentration of carbon in the deposited sub-layer is, and conversely, the lower the flow of the reactant gas is, the greater the concentration of carbon in the deposited sub-layer is.

To relate the deposition of the second sub-layer 62 to operation 304 more specifically, after the completion of the first number of cycles, at operation 320, a determination is made to repeat the cycle to initiate the second number of cycles. At operation 322, a determination is made that the amounts of the gases are to be altered. In response, at operation 310, for example, the amounts of the precursor gases are determined to be 50% carbon-rich tantalum nitride precursor gas and 50% carbon-poor tantalum nitride precursor gas as the precursor gas (e.g., without considering the carrier gas) to be pulsed in operation 312, and the amount of the reactant gas is determined to be in a range from greater than 0% to about 99% of the total flow (e.g., flow of the combined reactant gas and carrier gas) to be pulsed in operation 316. The cycle (operations 312, 314, 316, 318) is repeated the second number of cycles by operation 320, without the gases subsequently being altered by operation 322.

Further in operation 304 after the performance of the second number of cycles, a third number of cycles is performed using the carbon-poor tantalum nitride precursor gas, with no carbon-rich tantalum nitride precursor gas, to deposit the third sub-layer 64 (e.g., a carbon-poor tantalum nitride layer). Additionally, the reactant gas may be pulsed in the second number of cycles at a high percentage amount, such as in a range from about 10% to about 99% of the total flow (e.g., flow of the combined reactant gas and carrier gas).

To relate the deposition of the third sub-layer 64 to operation 304 more specifically, after the completion of the second number of cycles, at operation 320, a determination is made to repeat the cycle to initiate the third number of cycles. At operation 322, a determination is made that the amounts of the gases are to be altered. In response, at operation 310, the amounts of the precursor gases are determined to be 0% carbon-rich tantalum nitride precursor gas and 100% carbon-poor tantalum nitride precursor gas as the precursor gas (e.g., without considering the carrier gas) to be pulsed in operation 312, and the amount of the reactant gas is determined to be in a range from about 10% to about 99% of the total flow (e.g., flow of the combined reactant gas and carrier gas) to be pulsed in operation 316. The cycle (operations 312, 314, 316, 318) is repeated the third number of cycles by operation 320, without the gases subsequently being altered by operation 322. At the conclusion of the third number of cycles, at operation 320, a determination is made that a cycle is to be not repeated, and then, operation 306 is performed.

In operation 306, the differential carbon-concentration tantalum nitride layer deposited in operation 304 is treated using a plasma process. Generally, the plasma process can remove organic impurities and can also densify the differential carbon-concentration tantalum nitride layer.

The carbon-moderate tantalum nitride layer (e.g., the second sub-layer 62) can have properties between the ranges of properties described above for the carbon-rich tantalum nitride layer and the carbon-poor tantalum nitride layer. Hence, the differential carbon-concentration tantalum nitride layer can permit for balancing and tuning of properties to achieve a desired barrier layer. Additional layers can be implemented in the differential carbon-concentration tantalum nitride layer.

Even further, by increasing the number of times where the respective amounts of the carbon-rich tantalum nitride precursor gas, the carbon-poor tantalum nitride precursor gas, and/or reactant gas are to be altered by operation 322, which may correspondingly decrease the number of cycles between each alteration of the gases, the differential carbon-concentration tantalum nitride layer may begin to approximate or be a gradient layer, where, as deposited, the gradient layer can have a substantially continuous gradient concentration of carbon. This can further permit for balancing and tuning of properties to achieve a desired barrier layer.

As a specific example, assume that the differential carbon-concentration tantalum nitride layer is to be deposited using 19 cycles of the ALD process of operation 304. At operation 310 for the first cycle, the gases to be pulsed are determined to be: 100% carbon-rich tantalum nitride precursor gas, 0% carbon-poor tantalum nitride precursor gas, and 5% reactant gas consistent with the above description. The first cycle implements these amounts. After each cycle, a determination at operation 322 is made that the amounts are to be altered, and at operation 310, the amounts are determined to: decrease the carbon-rich tantalum nitride precursor gas to be 5.55% less, increase the carbon-poor tantalum nitride precursor gas to be 5.55% more, and increase the reactant gas to be 5% more. At the last cycle (e.g., cycle 19), the gases to be pulsed are determined to be: 0% carbon-rich tantalum nitride precursor gas, 100% carbon-poor tantalum nitride precursor gas, and 95% reactant gas consistent with the above description.

Figure 13:
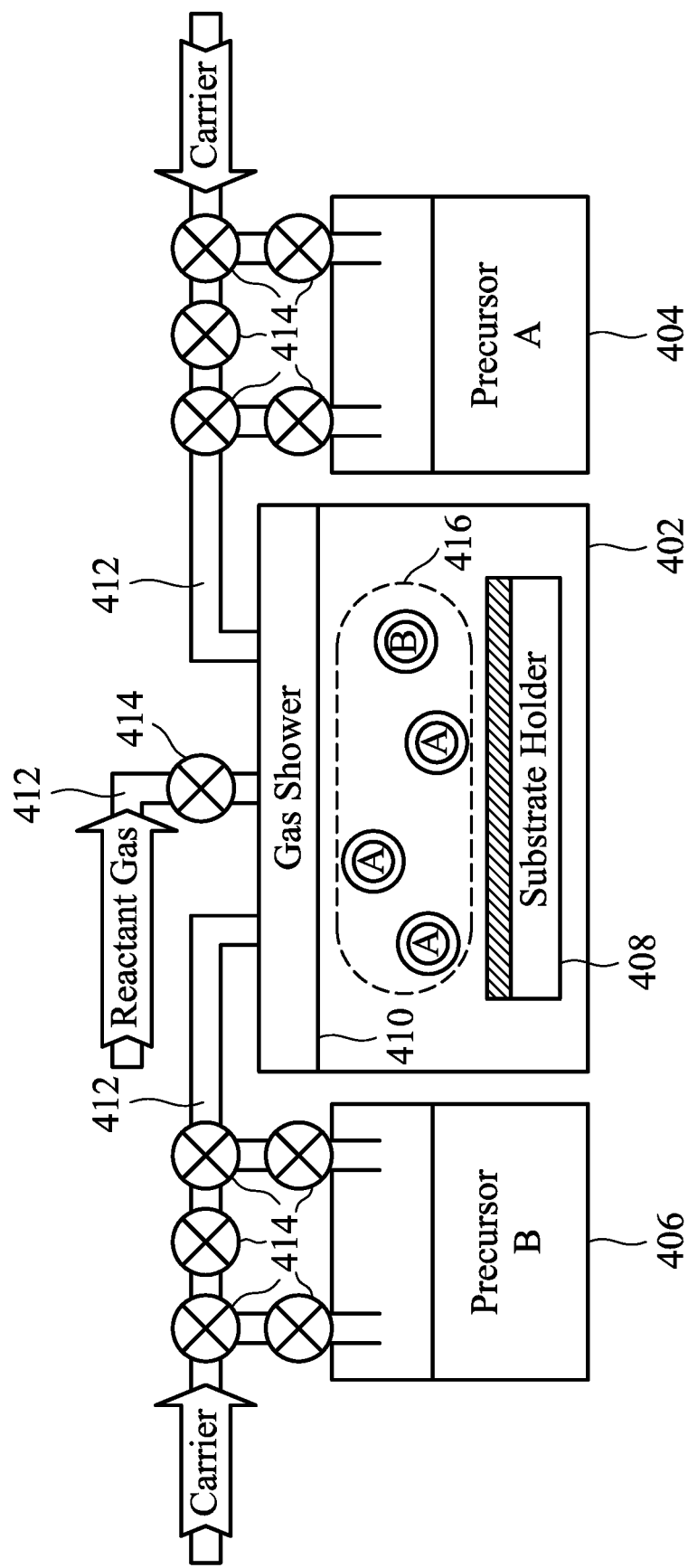
FIG. 13 is a schematic of a deposition tool for forming a barrier layer in a conductive feature in accordance with some embodiments.

FIG. 13 is a schematic of a deposition tool for forming a barrier layer in a conductive feature in accordance with some embodiments. More particularly, the deposition tool includes a dual-ampoule supply system for delivery of two precursors. The deposition tool includes a chamber 402, a first ampoule 404, and a second ampoule 406. A substrate holder 408 is disposed in the chamber 402. The substrate holder 408 holds and secures a substrate during a deposition process. The chamber 402 also includes a gas shower 410 for distributing gases within the chamber 402. Flow lines 412 and valves 414 are configured and operable to fluidly couple the first ampoule 404 and the second ampoule 406 to the chamber 402. The flow lines 412 and valves 414 are configured and operable to selectively transmit a first precursor A from the first ampoule 404, a second precursor B from the second ampoule 406, one or more carrier gases, and a reactant gas to the chamber 402 for dispersion via the gas shower 410.

The deposition tool can be used to implement the deposition processes described above. For example, various valves 414 can be selectively opened or closed to begin or stop transmitting the various gases to the chamber 402 to achieve an ambient 416 in the chamber 402. Assuming the first precursor A is a carbon-rich tantalum nitride precursor gas and the second precursor B is the carbon-poor tantalum nitride precursor gas, various valves 414 can be opened or closed to transmit only the first precursor A, only the second precursor B, or a mixture of the first precursor A and the second precursor B, with or without a carrier gas, to the chamber 402 for, e.g., the pulse operation 312. Similarly, various valves 414 can be opened or closed to transmit the reactant gas to the chamber 402 for, e.g., the pulse operation 316. Further, various valves 414 can be opened or closed to transmit the carrier gas to the chamber 402 for, e.g., the purge operations 314, 318.

An embodiment is a method for semiconductor processing. An opening is formed through a dielectric layer to a conductive feature. A barrier layer is formed in the opening along a sidewall of the dielectric layer and on a surface of the conductive feature. Forming the barrier layer includes depositing a layer including using a first precursor gas. The first precursor gas has a first incubation time for deposition on the surface of the conductive feature and has a second incubation time for deposition on the sidewall of the dielectric layer. The first incubation time is greater than the second incubation time. A conductive fill material is formed in the opening and on the barrier layer.

Another embodiment is a structure. The structure includes a first dielectric layer over a substrate, a first conductive feature in the first dielectric layer, a second dielectric layer over the first dielectric layer and the first conductive feature, and a second conductive feature in the second dielectric layer and contacting the first conductive feature. The second conductive feature includes a barrier layer and a conductive fill material on the barrier layer. The barrier layer is along a sidewall of the second dielectric layer and on a surface of the first conductive feature. The barrier layer has a first thickness at the sidewall of the second dielectric layer, and the barrier layer has a second thickness at the surface of the first conductive feature. The first thickness is greater than the second thickness.

A further embodiment is a method for semiconductor processing. An opening is formed through a dielectric layer to a conductive feature. A carbon-containing layer is deposited in the opening along a sidewall of the dielectric layer and on a surface of the conductive feature. Depositing the carbon-containing layer includes using an atomic layer deposition (ALD) process. The ALD process includes at least one first cycle comprising pulsing a precursor gas having a carbon concentration of at least 25 atomic percent and pulsing a reactant gas. The carbon-containing layer is densified, and the densification includes exposing the carbon-containing layer to a plasma. After the densifying, the carbon-containing layer is a barrier layer. A conductive fill material is formed in the opening and on the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming an opening through a dielectric layer to a conductive feature;
   forming a barrier layer along a sidewall of the dielectric layer and an upper surface of the conductive feature, wherein forming the barrier layer comprises:
      forming a first sub-layer along on the sidewall of the dielectric layer and on the upper surface of the conductive feature, wherein a first thickness of the first sub-layer on the sidewall of the dielectric layer is greater than a second thickness of the first sub-layer on the upper surface of the conductive feature, wherein the first thickness is greater than the second thickness; and
      forming a plurality of additional sub-layers on the first sub-layer, wherein each of the plurality of additional sub-layers has a difference between a thickness of a respective one of the plurality of additional sub-layers over the sidewall of the dielectric layer and a thickness of the respective one of the plurality of additional sub-layers over the upper surface of the conductive feature is less than a difference between the first thickness and the second thickness; and
   forming a conductive material over the barrier layer;
   wherein forming the barrier layer comprises, after forming the plurality of additional sub-layers and prior to forming the conductive material, performing a plasma treatment.

2. The method of claim 1, wherein the plasma treatment comprises a hydrogen plasma treatment.

3. The method of claim 1, wherein after the plasma treatment, an uppermost sub-layer of the plurality of additional sub-layers has a greater density than the first sub-layer.

4. The method of claim 1, wherein after the plasma treatment, each of the plurality of additional sub-layers has a greater density than the first sub-layer.

5. The method of claim 1, wherein after the plasma treatment, the first sub-layer has a higher carbon concentration than the plurality of additional sub-layers.

6. The method of claim 1, wherein as deposited, the first sub-layer has a higher carbon concentration than each of the plurality of additional sub-layers.

7. A method of forming a semiconductor device, the method comprising:
   forming an opening through a dielectric layer to a conductive feature;
   forming a barrier layer along a sidewall of the dielectric layer and an upper surface of the conductive feature, wherein forming the barrier layer comprises:
      forming a first sub-layer along the sidewall of the dielectric layer and on the upper surface of the conductive feature, wherein a first thickness of the first sub-layer on the sidewall of the dielectric layer is greater than a second thickness of the first sub-layer on the upper surface of the conductive feature, wherein the first thickness is greater than the second thickness; and
      forming one or more additional sub-layers on the first sub-layer, wherein forming each of the first sub-layer and one or more additional sub-layers comprises
         performing one or more pulsing cycles, wherein each of the one or more pulsing cycles comprises pulsing a carbon-containing precursor gas and pulsing a reactant gas; and
         reducing a concentration of carbon in the carbon-containing precursor gas; and
   forming a conductive material over the barrier layer.

8. The method of claim 7, wherein pulsing the carbon-containing precursor gas is performed prior to pulsing the reactant gas.

9. The method of claim 7, wherein pulsing the reactant gas is performed prior to pulsing the carbon-containing precursor gas.

10. The method of claim 7, wherein forming the barrier layer further comprises performing a plasma treatment, the plasma treatment densifying at least an uppermost sub-layer of the one or more additional sub-layers.

11. The method of claim 10, wherein the first sub-layer and the one or more additional sub-layers comprises tantalum nitride.

12. The method of claim 7, wherein the carbon-containing precursor gas comprises $Ta,[(3,4\text{-eta})\text{-alkyne}]$ tris (N,N-alkylaminato) $(Ta[N(CH_3)_2]_3(C_6H_{10}))$ or $Ta[N(C_2H_5)_2]_3NC(CH_3)_3$.

13. The method of claim 7, wherein:
   pulsing the carbon-containing precursor gas comprises pulsing a carbon-rich tantalum nitride precursor gas and a carbon-poor tantalum nitride precursor gas, and
   reducing the concentration of carbon in the carbon-containing precursor gas comprises reducing a ratio of a flow of the carbon-rich tantalum nitride precursor gas to a flow of the carbon-poor tantalum nitride precursor gas.

14. A method of forming a semiconductor device, the method comprising:
   forming an opening through a dielectric layer to a conductive feature;
   forming a barrier layer along a sidewall of the dielectric layer and an upper surface of the conductive feature, wherein forming the barrier layer comprises forming a plurality of sub-layers along on the sidewall of the dielectric layer and on the upper surface of the conductive feature, wherein a first thickness of a lowermost sub-layer on the sidewall of the dielectric layer is greater than a second thickness of the lowermost sub-layer on the upper surface of the conductive feature, wherein forming each of the plurality of sub-layers comprises pulsing a carbon-containing gas and pulsing a reactant gas; and
   forming a conductive material over the barrier layer.

15. The method of claim 14, wherein forming the plurality of sub-layers comprises reducing a carbon concentration of the carbon-containing gas.

16. The method of claim 14, wherein the carbon-containing gas comprises a carbon-rich gas and a carbon-poor gas.

17. The method of claim 16 further comprising decreasing a flow of the carbon-rich gas and increasing a flow of the carbon-poor gas.

18. The method of claim 14 further comprising, prior to forming the conductive material, performing a plasma treatment to densify at least an uppermost sub-layer of the plurality of sub-layers.

19. The method of claim 14, wherein the reactant gas comprises ammonia or hydrazine.

* * * * *